United States Patent [19]
Yunus et al.

[11] Patent Number: 6,118,331
[45] Date of Patent: *Sep. 12, 2000

[54] METHOD AND SYSTEM FOR A DIGITAL FILTER HAVING IMPROVED SETTLING TIME

[75] Inventors: Mohammad Yunus, Fremont; Sofjan Goenawan, Milpitas; Peter W. Cheng, Fremont, all of Calif.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/878,849

[22] Filed: Jun. 20, 1997

[51] Int. Cl.[7] ....................................................... H13K 5/00
[52] U.S. Cl. ........................................... 327/553; 327/552
[58] Field of Search ..................................... 327/551, 552, 327/553, 116, 94, 337, 334; 333/17.1

[56] References Cited

U.S. PATENT DOCUMENTS

| | | | |
|---|---|---|---|
| 4,767,520 | 8/1988 | Asakura et al. | 204/406 |
| 5,392,456 | 2/1995 | Mitomo et al. | 333/17.1 |

*Primary Examiner*—Dinh T. Le
*Attorney, Agent, or Firm*—Sawyer Law Group LLP

[57] ABSTRACT

A method and system for providing a filter having an increased speed and decreased settling time are disclosed. The method and system comprise summing means for adding and subtracting. The method and system further comprise means coupled to the summer for providing a delay; and a clock coupled to the delay providing means. The clock determines a number of samples during a predetermined time. The clock is operated at a plurality of frequencies such that the total number of samples during the predetermined time is a predetermined number. According to the method and system disclosed, the filter has an increased speed. The increased speed of the filter can operate to extend the lifetime of power devices.

10 Claims, 6 Drawing Sheets

METHOD AND SYSTEM FOR A DIGITAL FILTER HAVING IMPROVED SETTLING TIME

FIELD OF INVENTION

The present invention relates to digital signal processing and in particular to a method and system for providing a digital filter having an improved settling time.

BACKGROUND OF INVENTION

Digital Signal Processing (DSP) is being implemented extensively, due to the advances in the VLSI technology. The fabrication of high speed and high complexity DSP circuitry can now be accomplished in a cost effective manner by using subricron geometry processes.

One large area of DSP is digital filters. Digital filters have found application in systems which used to be implemented predominately in the analog domain. An example of application where digital filters are used is the Sigma Delta Analog to Digital Converter (ΣΔ ADC). The ΣΔ ADC is an oversampling converter where the input is sampled at a much higher rate than the Nyquist frequency. The ADC typically consists of two parts: the Sigma-Delta modulator and the digital filter. The modulator converts the analog input into a digital bit stream. The bit stream output of the modulator could be 1 bit or a few bits. The modulator also shapes the quantization noise such that the energy of the low frequency noise is very low and the energy of the high frequency noise is increased due to filtering the modulator loop. The digital filter used in this architecture serves two purposes. First, it suppresses the high frequency noise produced by the modulator. Hence, it is generally a low pass filter. Second, the digital filter converts the single bit or a few bit wide digital output of the modulator into a N bit digital number. The number N is determined by the desired resolution of the system. The typical value of N is from 8 to 20 bits.

The conversion time of the ΣΔ ADC system is limited by the digital filter due to its low bandwidth for high resolution. In order to achieve a desired resolution for a given system, the digital filter needs to accumulate a pre-determined number of samples. The resolution of the system dictates the number of data samples. Thus, for higher resolution systems, a relatively long time is required due to long filtering time for the ADC.

For example, in many battery operated systems, the device is periodically powered on momentarily to acquire the data and the power is conserved. However, the system has to be powered long enough to allow the output to reach the final value within a desired error band. Thus, it is imperative to have fast settling ΣΔ ADC for low power requirement application.

One such system is a gas flow and leak detection device that consumes 200 uA and has a conversion rate of 5 ms. The application requires data to be collected every second. Thus, once every second, the device needs to be powered on for 5 ms. The average current is thus (200 uA * 5 ms)/1s=1 uA. If a faster filter is implemented on the device that shortens the conversion time to 4 ms while the current consumption remain the same, the average current for the device can be lowered to 0.8 uA, a 20% saving. A battery with capacity of 100 mA*hour can power the device for 14.3 years instead of 11.4 years, a 25% improvement in battery life. Since only authorized personnel are allowed to replace the battery, a longer battery life is very significant cost in the application. This can have a tremendous cost savings as this gas flow and leak detector is placed on four million households. There are many other applications where frequent battery replacement is costly or troublesome for example, tire pressure measurement device that is mounted inside the tire; pacemaker; air plane "black box" recorder, etc. The improvement of battery life time due to faster filter would have significant impact in such applications.

Accordingly, what is needed is a method and system for providing a digital filter that rapidly reaches the desired value in spite of a long time constant of the filter. Thus, the new system will be low noise (longer time constant) but a very fast response time as the power is turned on. Thus, the number of samples required will be dramatically reduced to a smaller number. The present invention addresses the design of such a filter scheme that will reduce the settling time and keep the low bandwidth. The same idea can be extended to band pass filter or any other types of noise shaping filters. Furthermore, this novel idea can be implemented with analog and mixed signal circuitry.

SUMMARY

The present invention provides a method and system for providing a filter having an increased speed by decreasing settling time. The method and system comprise summing means for adding and subtracting. The method and system further comprise means coupled to the summer for providing a delay; and a clock coupled to the delay providing means. The clock determines a number of samples during a predetermined time. The clock is operated at a plurality of frequencies such that the total number of samples during the predetermined time is a predetermined number.

According to the method and system disclosed, a faster digital filter having a shorter settling time is provided. The increased speed of the filter can operate to extend the lifetime of power devices (battery). Overall system performance is thereby improved in terms of the life of the system from the from the same power source.

DETAILED DESCRIPTION

The present invention relates to an improvement in peripheral digital filters. The following description is presented to enable one of the ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described.

Figure 1:
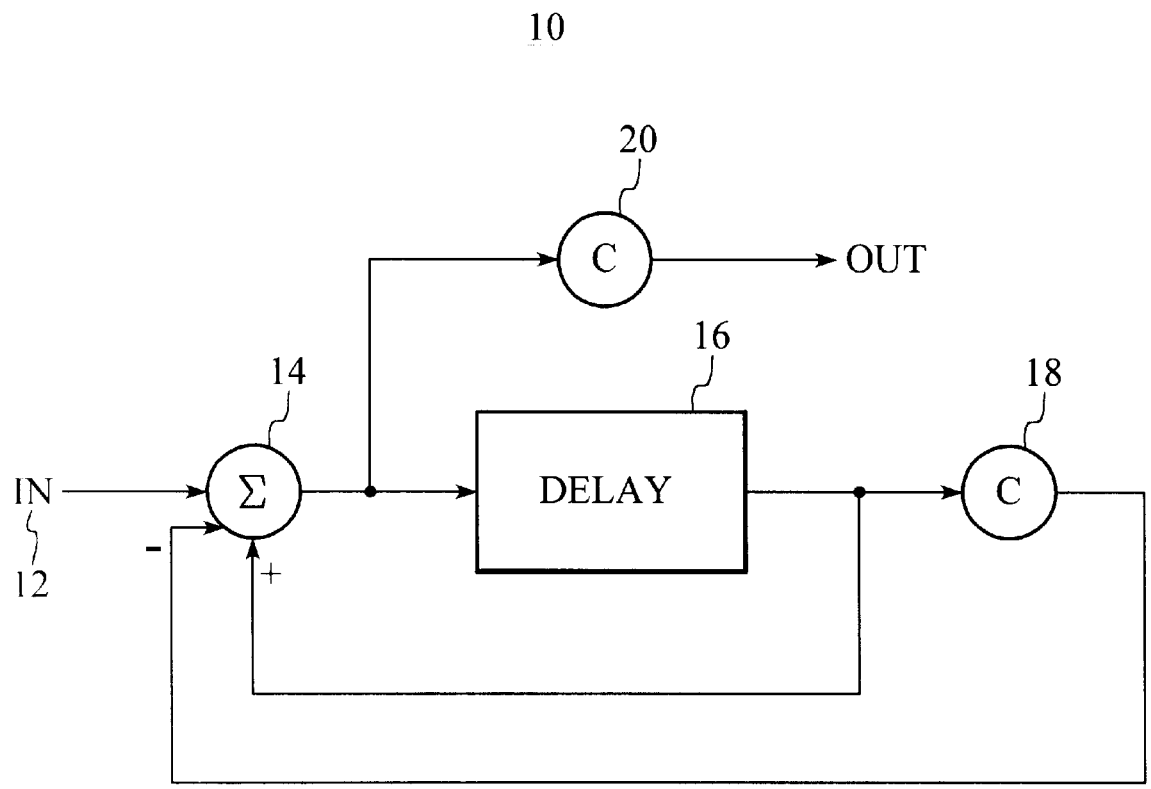
FIG. 1 is a simplified block diagram of a conventional low pass digital filter.
Figure 4:
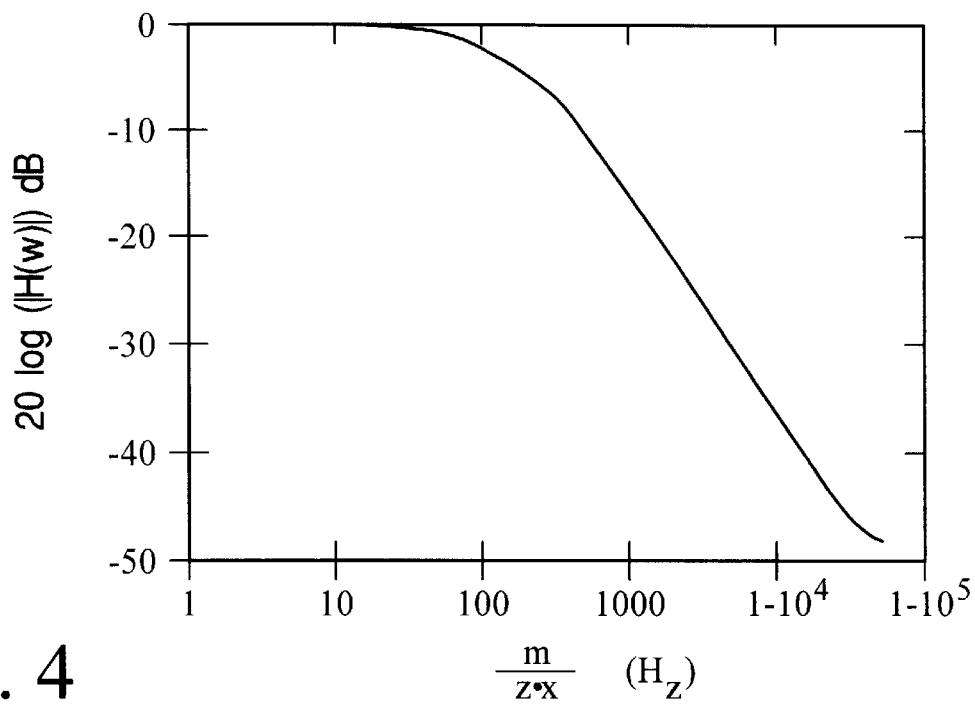
FIG. 4 is a plot of the frequency response of a conventional digital filter.
Figure 5:
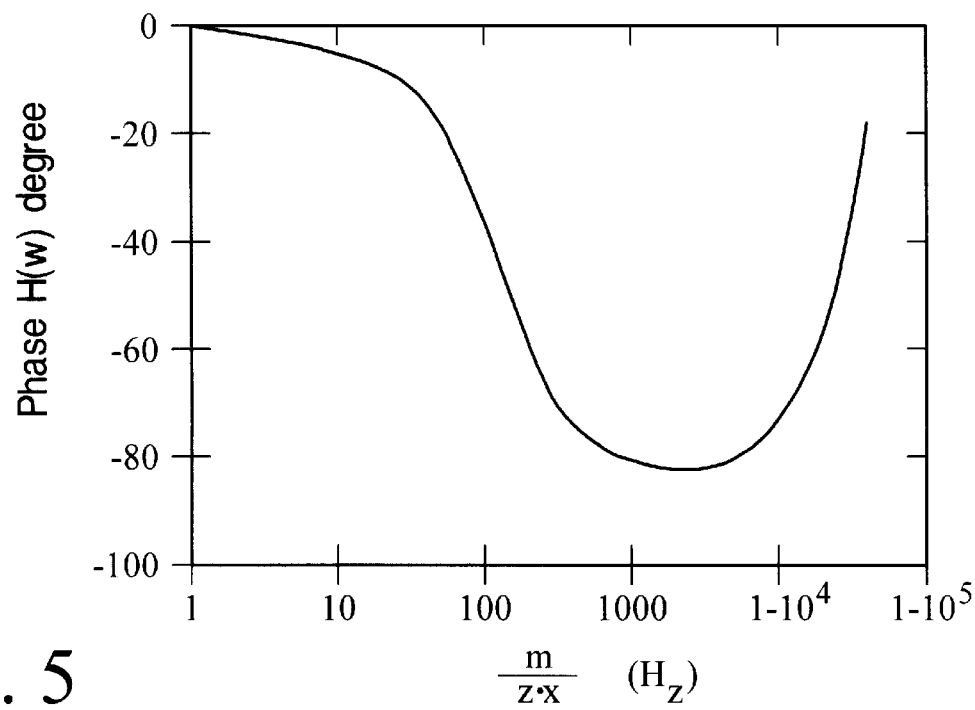
FIG. 5 is a plot of the phase response of a conventional digital filter.

FIG. 1 illustrates a block diagram of an Infinite Impulse Response (IIR) low pass digital filter 10. The transfer function of the filter is shown in equation 1.

$$H(z) = \frac{c}{1-(1-c)\cdot z^{-1}} \quad \text{equation 1}$$

where c is a constant that determines the 3db point in the frequency response as shown in FIG. 4 and 5. FIG. 4 is the amplitude response and FIG. 5 is the phase response.

Figure 2:
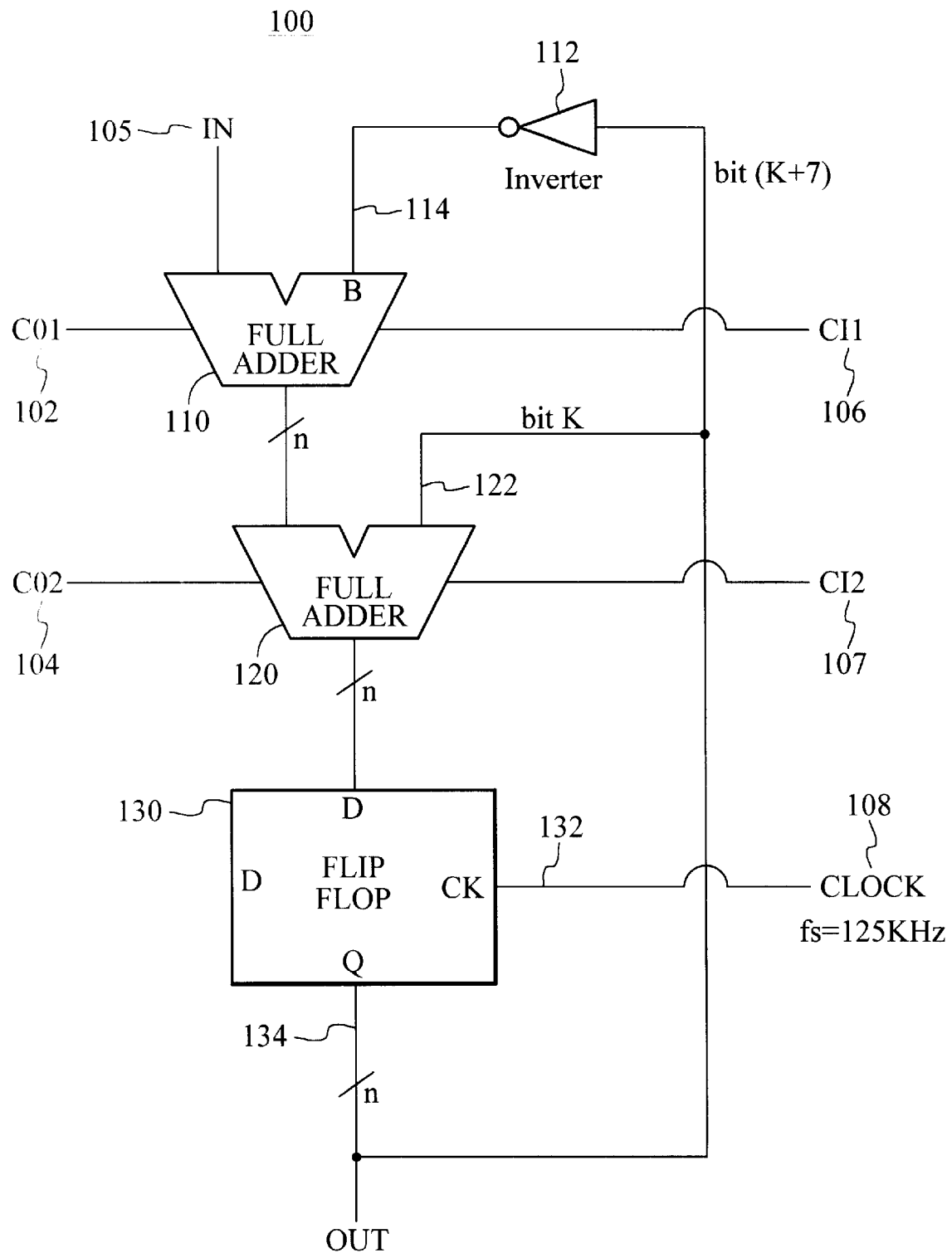
FIG. 2 is a implemtation of a conventional low pass digital filter using digital circuit blocks.

The low pass digital filter 10 of FIG. 1 can be accomplished using standard digital hardware. The summer 14 can be implemented using full adders and a D-Flip/Flop can be used to produce a one clock delay 16. The subtraction can be done using 2's complement arithmetic, which inverts all bits and then adds 1. FIG. 2 shows the hardware configuration 100 of the low pass filter 10 of FIG. 1. The constant c is $2^{-7}$. Input to port B 114 is the realization of the subtraction term, an inverted output of bit (k+7). The 2's complement subtraction can be completed by connecting CI1 106 to HIGH (equivalent of adding 1). The clock 108 is operated at a fixed sampling frequency, fs. In one conventional filter 100, fs is 125 kHz. The input is sampled once per sampling period.

Equation 1 is a low pass filter with unity gain in the pass band. For a step input, the output value approaches the input in the exponential manner. The time constant determining the approach depends on constant c. Thus enough time must be allowed for the filter to settle to the desired output.

For example, with $c=2^{-7}$, equation 1 needs 1024 cycles to reach 99.96% (11 bits accuracy) of its final value. Consequently, when the sampling frequency is 125 kHz, the conversion time is 819.2 us. The speed of the ADC is thus limited by the digital filter. For higher resolution in an ADC using conventional filter 100, c needs to be smaller or a higher order filter must be used to suppress more noise. However, either option increases the conversion time, slowing the filter.

For the filter of equation 1, the output settles to its final value exponentially. A filter in accordance with the method and system utilizes more than one clock frequency. During the initial portion of the conversion period, the input samples is frequently enough to bring the output quickly to the final value with lower resolution. At the second portion of the conversion period, the output settles slowly to its final value with the required resolution.

The method and system divides the conversion period into two portions: the Coarse Sampling Period (CSP) and the Fine Sampling Period (FSP). During CSP, the filter is operated at a higher rate than normal sampling frequency. The input is thus sampled more than once per normal sampling period. This brings the output to its final value much more quickly than conventional filters. During the fine sampling period, the input is sampled at the normal mode of once per sampling period. Using computer simulation, the coarse and fine sampling periods can be defined so that the signal-to-noise ratio is maintained. The conversion time is shortened due to the multiple sampling of the input during the coarse sampling period.

Figure 3A:
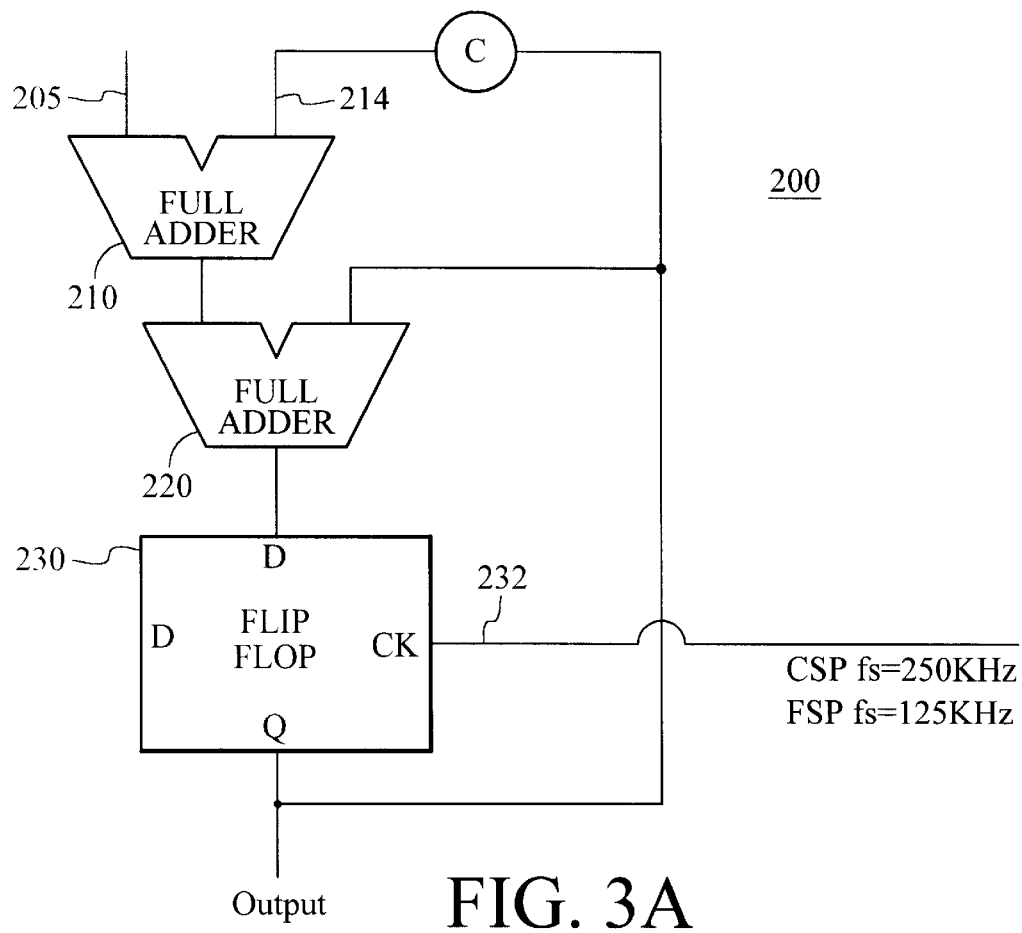
FIG. 3a is a block diagram of one embodiment of a digital filter in accordance with the method and system.
Figure 3B:
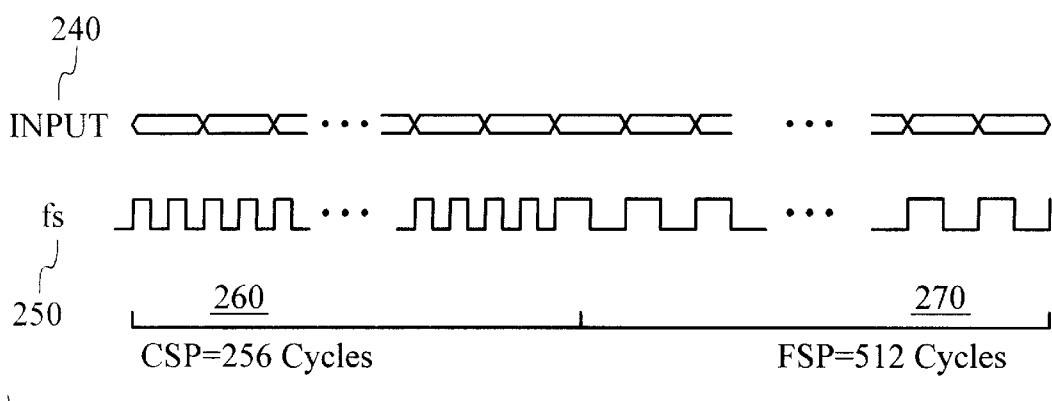
FIG. 3b is a timing diagram of one embodiment of a digital filter in accordance with the method and system.

Implementing the method and system in a filter having the transfer characteristics shown in equation 1 will result in a faster settling time. To illustrate more particularly the method and system in accordance with the present invention, refer to FIG. 3, which displays one embodiment of a filter 200 in accordance with the method and system. According to the method and system, in the filter 200, the sampling frequency of clock during CSP is 250 kHz, which is twice the normal rate. Consequently, the input is sampled twice per normal sampling frequency during the CSP. In one embodiment, the duration of CSP is 256 cycles. During FSP, the sampling frequency of clock 232 is 125 kHz. Thus, in one embodiment of filter 200, the sampling frequency during FSP is the same as that of a conventional filter having the same application. In one embodiment, the duration of the FSP is 512 cycles. Since the input is sampled twice per sampling period for 256 cycles during the CSP, followed by 512 cycles in FSP, the effective total number of input samples are 1024. This total number of samples is the number required for an 11 bit resolution settling. However, only 768 conventional sampling periods have elapsed. Thus, an improvement of 256 cycles is achieved. This is a 25% improvement in conversion time over conventional methods.

In order to achieve better performance, the noise rejection criteria must be satisfied, despite the division of the conversion period into CSP and FSP. Computer simulation may be conducted during the design phase so that the filter performance is not compromised. The following is a mathematical proof that the method and system results in a faster settling time has minimal effect in the overall performance.

FIG. 4 shows the frequency response of a conventional filter 10, whose transfer function is shown in equation 1, having fs=125 kHz and $c=2^{-7}$. FIG. 5 shows the phase response of such a conventional filter 10.

Referring back to FIG. 3a, the transfer function must be calculated separately for each period because different sampling rates during CSP and FASP are utilized by filter 200. In one embodiment, the transfer function is evaluated at fs=250 kHz during CSP, and fs=125 kHz during FSP. For CSP, the input sampling is twice of the conventional sampling period. Since the duration is 256 cycles, the effective total sampling is 512 input samples. The transfer function during the CSP can be approximated by the series expansion of equation 1 up to 512 cycles, and taking into account that the input is the same for two cycles. The transfer function of filter 200 is shown in equation 2:

$$HCSP(z) = c \cdot (1+a) \cdot (a^{512} \cdot z^{-512}) \cdot \frac{1-(a^2 \cdot z^{-1})^{256}}{1-a^2 \cdot z^{-1}} \quad \text{equation 2}$$

where $a=(1-c)=(1-2^{-7})$.

The transfer function during FSP can be approximated as in equation 3.

$$HFSP(z) = c \cdot \frac{1-(a \cdot z^{-1})^{512}}{1-a \cdot z^{-1}} \quad \text{equation 3}$$

The total response of the filter is a combination of HCSP(z) and HFSP(z). The total response is given by equation 4.

$$HTOTAL(z) = HCSP(z) + HFSP(z) \quad \text{equation 4}$$

As mentioned above, HCSP(z) is evaluated with fs=250 kHz, and HFSP(z) is evaluated with 125 kHz.

In order to compare with the transfer function equation 1, the difference of H(z) and HTOTAL(z) is calculated. Thus, the difference is given by equation 5.

$$HDIF(z)=H(z)-HTOTAL(z) \qquad \text{equation 5}$$

Figure 6:
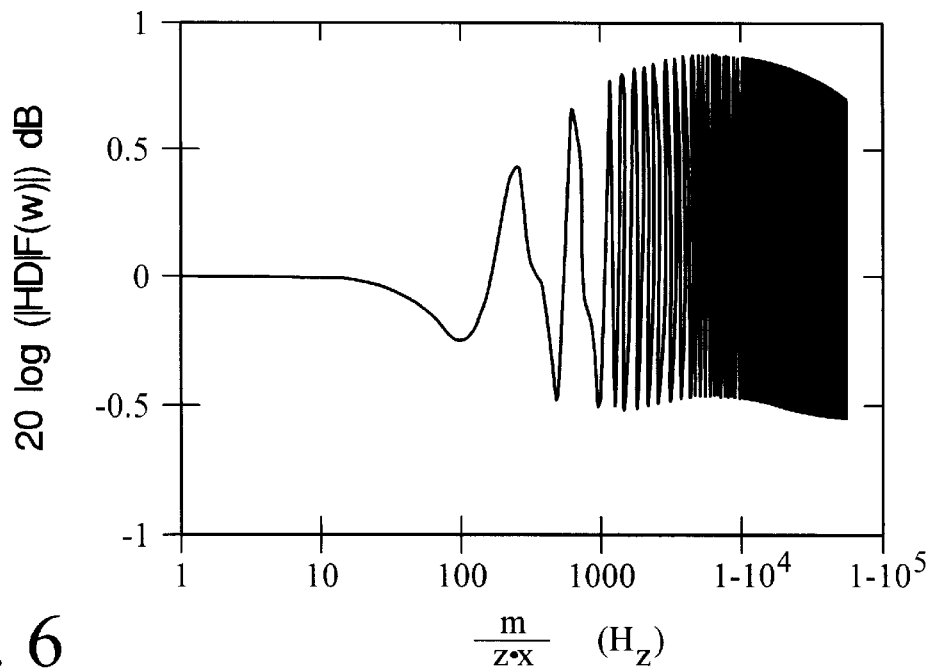
FIG. 6 is a plot of the difference in magnitude of the response of one embodiment of a digital filter in accordance with the method and system and a conventional digital filter.
Figure 7:
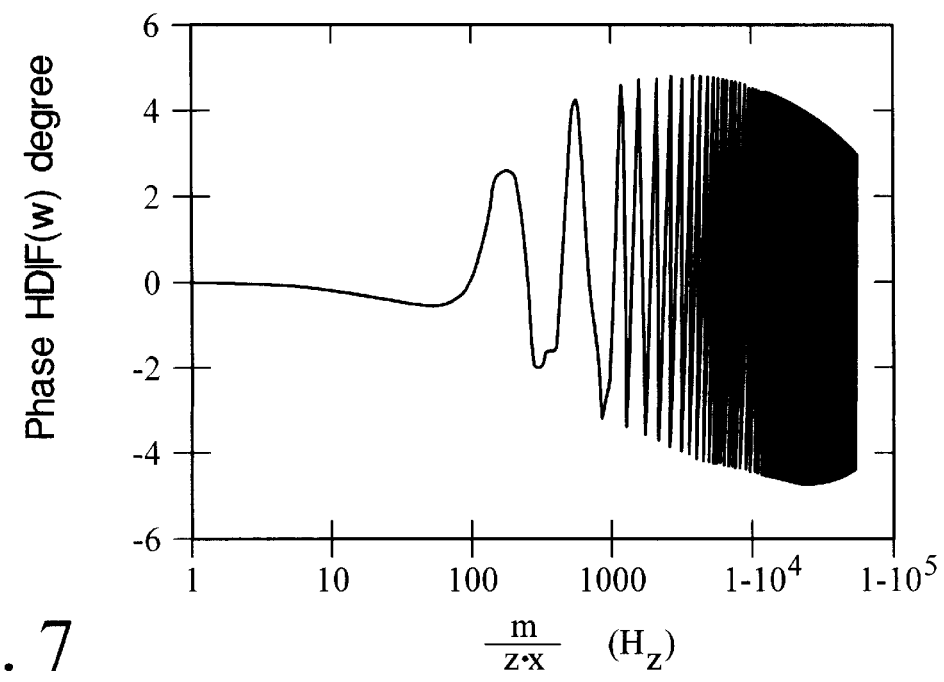
FIG. 7 is a plot of the phase difference of the response of one embodiment of a digital filter in accordance with the method and system and a conventional digital filter.

This difference between a conventional filter and one embodiment of a filter in accordance with the method and system is plotted in FIGS. 6 and 7. FIG. 6 shows the magnitude difference and FIG. 7 shows the phase difference between a conventional filter 10 and a filter 200 in accordance with the method and system. Both plots show that in the pass band, the error is very small. In addition, in the stop band, the magnitude error is within 1 dB and the phase error is within plus or minus five degrees.

The method and system can be extended to dividing the CSP into subdivisions with different sampling frequency for each period. The method and system can also be implemented for cascaded structure for higher order filtering.

Figure 8:
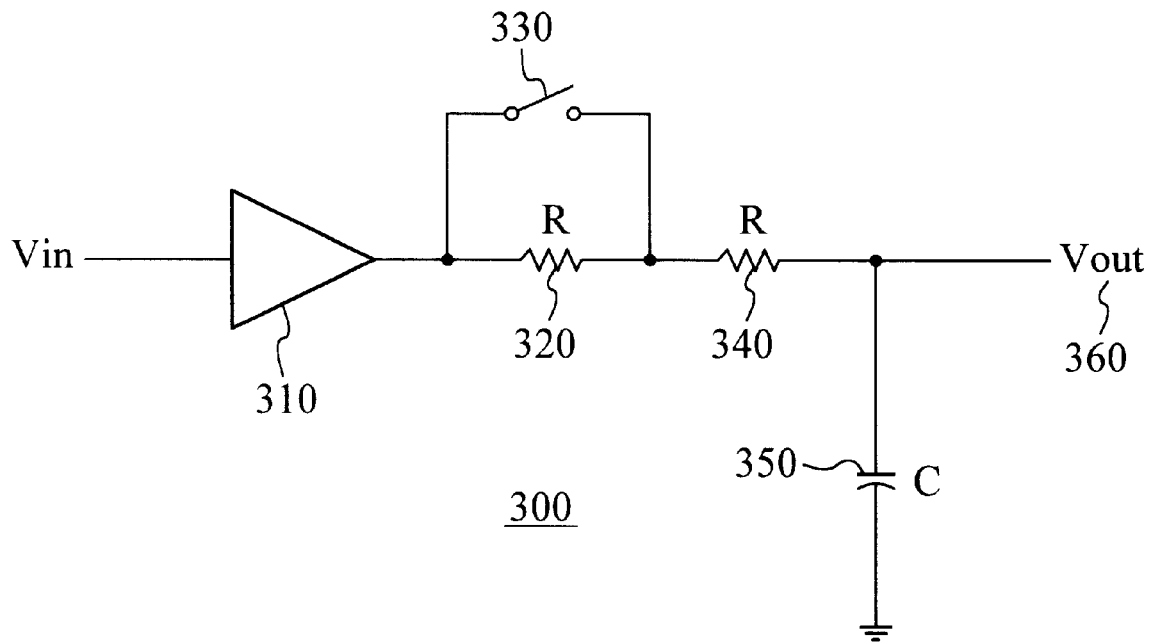
FIG. 8 is a schematic of one embodiment of an analog filter in accordance with the method and system.

Finally, the method and system can be extended to the analog RC filter. FIG. 8 shows the schematic of an analog filter 300. The output 360 of the filter 300 settles to its final value exponentially according to equation 6.

$$f(t)=1-\exp(t/\tau) \qquad \text{equation 6}$$

where $\tau$ is the time constant proportional to the value R of resistor 320 or 340 and the value C of capacitor 350. During CSP, resistor 320 is shorted by the switch 330 so that the output approaches its final value much more quickly with a smaller time constant. Then during FSP, the switch 330 is open and appropriate filtering is done by the RC filter 300.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims. One such method is to modify the value of the constant "c" for the first phase to speed up the response time and later use the correct value of "c".

What is claimed is:

1. A digital filter comprising:

a summer that receives a signal at a first input, the summer including a second input;

means coupled to the summer for providing a delay, the means for providing the delay also providing a delayed signal, the delayed signal being provided to the second input of the summer;

a clock, coupled to the means for providing a delay, the clock determining a number samples of the signal taken by the digital filter during a single conversion time, the clock being operated at a plurality of frequencies during the single conversion time, such that the number of samples during the single conversion time is a predetermined number, the digital filter taking a sample of the predetermined number of samples each cycle of the clock; and an output, coupled with the means for providing the delay, for outputting the delayed signal.

2. The digital filter of claim 1 wherein the plurality of frequencies further comprises a first frequency and a second frequency, the first frequency being twice the second frequency.

3. The digital filter of claim 2 wherein a first half of the number of samples are taken while the clock operates at the first frequency and a second half of the number of samples is taken while the clock operates at the second frequency.

4. The digital filter of claim 3 wherein the summer further comprises a plurality of adders.

5. The digital filter of claim 4 wherein the means for providing a delay further comprises a D flip-flop.

6. A method for providing digital filter comprising the steps of:

a) providing a summer for receiving a signal, the summer including an input;

b) providing means coupled to the summer for providing a delay, the means for providing the delay also providing a delayed signal, the delayed signal being provided to the input of the summer and being output by the digital filter;

c) providing a clock coupled to the means for providing a delay for determining a number of samples during a single conversion time, the clock being operated at a plurality of frequencies during the settling time, such that the number of samples during the single conversion time is a constant, the digital filter taking a sample of the predetermined number of samples each cycle of the clock; and d) providing an output coupled with the means for providing the delay, for outputting the delayed signal.

7. The method of claim 6 wherein the plurality of frequencies further comprises a first frequency and a second frequency, the first frequency, the first frequency being twice the second frequency.

8. The method of claim 7 wherein a first half of the number of samples are taken while the clock operates at the first frequency and a second half of the number of samples is taken while the clock operates at the second frequency.

9. The method of claim 8 wherein the summer further comprises a plurality of adders.

10. The method of claim 9 wherein the means or providing a delay further comprises a D flip-flop.

* * * * *